US011497129B2

(12) United States Patent
Severin et al.

(10) Patent No.: US 11,497,129 B2
(45) Date of Patent: Nov. 8, 2022

(54) COMPOSITE MATERIAL STRAND MOUNTS AND ASSEMBLIES

(71) Applicant: CommScope Technologies LLC, Hickory, NC (US)

(72) Inventors: Matthew Severin, Grapevine, TX (US); Jacob Adams, The Colony, TX (US); Robert Campbell, Irving, TX (US); Dale Heath, Fort Worth, TX (US); Brian Cross, Double Oak, TX (US)

(73) Assignee: CommScope Technologies LLC, Hickory, NC (US)

( * ) Notice: Subject to any disclaimer, the term of this patent is extended or adjusted under 35 U.S.C. 154(b) by 144 days.

(21) Appl. No.: 17/194,490

(22) Filed: Mar. 8, 2021

(65) Prior Publication Data

US 2021/0289641 A1    Sep. 16, 2021

Related U.S. Application Data

(60) Provisional application No. 62/989,192, filed on Mar. 13, 2020.

(51) Int. Cl.
*H05K 5/02* (2006.01)
*F16M 13/02* (2006.01)
*H04W 88/08* (2009.01)

(52) U.S. Cl.
CPC .......... *H05K 5/0204* (2013.01); *F16M 13/02* (2013.01); *H05K 5/0217* (2013.01); *H04W 88/08* (2013.01)

(58) Field of Classification Search
CPC .... H05K 5/0204; H05K 5/0217; F16M 13/02; H04W 88/08
See application file for complete search history.

(56) References Cited

U.S. PATENT DOCUMENTS

| 6,337,438 B1 * | 1/2002 | Oyamada | H02G 15/117 |
| | | | 174/59 |
| 8,604,999 B2 * | 12/2013 | Abumrad | H01Q 1/24 |
| | | | 343/874 |
| 9,939,602 B2 * | 4/2018 | Allen | G02B 6/483 |

(Continued)

FOREIGN PATENT DOCUMENTS

| CN | 107407457 A | | 11/2017 | |
| KR | 2008025985 A | * | 3/2008 | ............... H02G 3/08 |
| WO | 2019118116 A1 | | 6/2019 | |

OTHER PUBLICATIONS

PCT Notification of Transmittal of the International Search Report and the Written Opinion of the International Searching Authority, or the Declaration, dated Jun. 23, 2021, for corresponding PCT International Application No. PCT/US2021/021307.

*Primary Examiner* — Eret C McNichols
(74) *Attorney, Agent, or Firm* — Myers Bigel, P.A.

(57) ABSTRACT

The present disclosure describes strand mounts for small cell radios and/or antennas. A strand mount may include a plurality of polymeric mounting tubes configured such that one or more small cell radios and/or antennas can be mounted thereto, a pair of polymeric retaining members, each retaining member having a plurality of apertures sized and configured to receive a corresponding end of each mounting tube, and one or more mounting brackets configured to secure the strand mount on a cable strand. Stand mount assemblies are also described herein.

17 Claims, 7 Drawing Sheets

(56) References Cited

U.S. PATENT DOCUMENTS

| | | | |
|---|---|---|---|
| 11,053,702 B2* | 7/2021 | Bucur | H04W 88/08 |
| 11,133,575 B2* | 9/2021 | Alrutz | H01Q 21/205 |
| 11,233,315 B2* | 1/2022 | Sivanandan | H04W 16/18 |
| 2003/0130010 A1* | 7/2003 | Monroe | H05K 5/0204 |
| | | | 455/560 |
| 2009/0231828 A1 | 9/2009 | Madore | |
| 2011/0309996 A1* | 12/2011 | Abumrad | H01Q 1/42 |
| | | | 343/872 |
| 2012/0069882 A1 | 3/2012 | Nino et al. | |
| 2016/0007488 A1* | 1/2016 | Neustadt | H01Q 1/246 |
| | | | 174/541 |
| 2016/0043515 A1* | 2/2016 | Colapietro | H01Q 1/1228 |
| | | | 439/529 |
| 2016/0336641 A1 | 11/2016 | Dipiero | |
| 2021/0135440 A1* | 5/2021 | Gupta | F16M 13/02 |
| 2021/0249762 A1* | 8/2021 | Severin | H01Q 1/42 |
| 2022/0255211 A1* | 8/2022 | Campbell | H02G 3/0456 |

\* cited by examiner

COMPOSITE MATERIAL STRAND MOUNTS AND ASSEMBLIES

RELATED APPLICATION(S)

The present application claims priority to and the benefit of U.S. Provisional Application Ser. No. 62/989,192, filed Mar. 13, 2020, the disclosure of which is hereby incorporated herein in its entirety.

FIELD

The present application is directed generally toward telecommunications equipment, and more particularly, small cell mounts and small cell mount assemblies.

BACKGROUND

Figure 1:
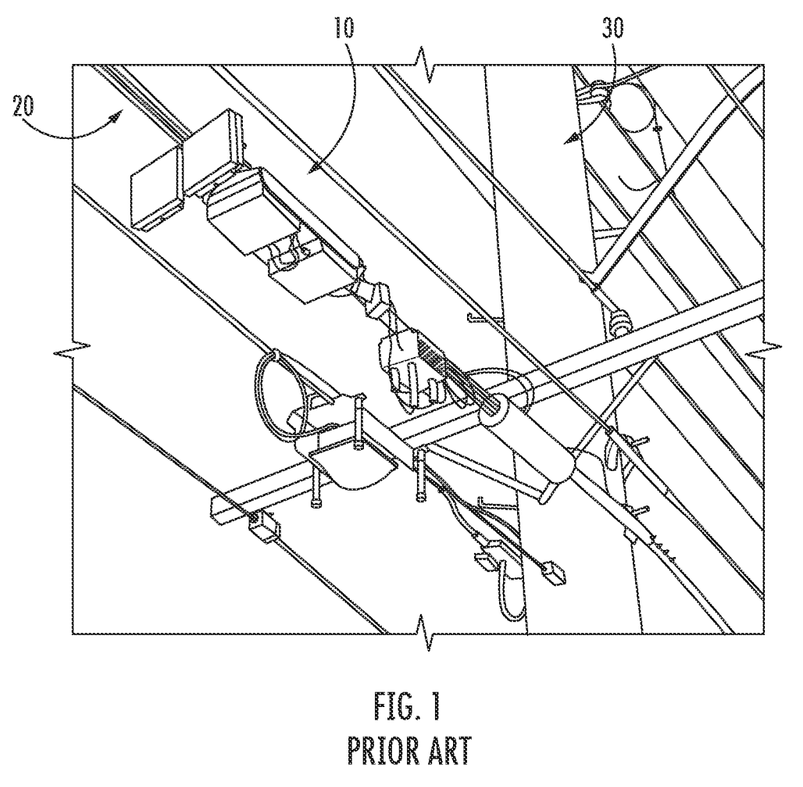
FIG. 1 is a photograph of a prior known strand mount.

Currently, very few strand mounts 10 for telecommunications equipment, such as cellular radios, exist (see, e.g., FIG. 1). Strand mounts 10 enable equipment to be mounted on cables 20, wires, or the like, that extend between utility poles 30 (e.g., telephone or power poles). The strand mounts 10 that currently exist in the market can be heavy which can make installation of the mounts 10 on a cable 20 burdensome to a technician. In addition, there are weight limitations that the cables 20, wires, or the like are able to withstand. There may be a need for strand mounts that allow for easier installation and increase serviceability, while also meeting weight limitations and reducing manufacturing costs.

SUMMARY

A first aspect of the present invention is directed to a strand mount. The strand mount includes a plurality of polymeric mounting tubes configured such that one or more small cell radios and/or antennas can be mounted thereto, a pair of polymeric retaining members, a polymeric retaining rod, and one or more mounting brackets. Each retaining member has a plurality of apertures sized and configured to receive a corresponding end of each mounting tube. The apertures of one retaining member receive a top portion of each mounting tube and the apertures of the other retaining member receive a bottom portion of each mounting tube. The retaining rod extends through the top portion of each mounting tube securing each mounting tube to one of the retaining members and preventing rotation of the mounting tubes relative to the retaining member. The mounting brackets are configured to secure the strand mount on a cable strand.

Another aspect of the present invention is directed to a strand mount assembly. The strand mount assembly includes a cable strand, one or more small cell radios and/or antennas, and a strand mount. The strand mount includes a plurality of polymeric mounting tubes, a pair of polymeric retaining members, a polymeric retaining rod, and one or more mounting brackets. Each retaining member of the mount has a plurality of apertures sized and configured to receive a corresponding end of each mounting tube. The apertures of one retaining member receive a top portion of each mounting tube and the apertures of the other retaining member receive a bottom portion of each mounting tube. The retaining rod extends through the top portion of each mounting tube securing each mounting tube to one of the retaining members and preventing rotation of the mounting tubes relative to the retaining member. The one or more small cell radios and/or antennas are secured to the mounting tubes and the mounting brackets secure the strand mount on the cable strand.

It is noted that aspects of the invention described with respect to one embodiment, may be incorporated in a different embodiment although not specifically described relative thereto. That is, all embodiments and/or features of any embodiment can be combined in any way and/or combination. Applicant reserves the right to change any originally filed claim and/or file any new claim accordingly, including the right to be able to amend any originally filed claim to depend from and/or incorporate any feature of any other claim or claims although not originally claimed in that manner. These and other objects and/or aspects of the present invention are explained in detail in the specification set forth below. Further features, advantages and details of the present invention will be appreciated by those of ordinary skill in the art from a reading of the figures and the detailed description of the preferred embodiments that follow, such description being merely illustrative of the present invention.

DETAILED DESCRIPTION

The present invention now is described more fully hereinafter with reference to the accompanying drawings, in which embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art.

The present invention now will be described more fully hereinafter with reference to the accompanying drawings, in which illustrative embodiments of the invention are shown. Like numbers refer to like elements throughout and different embodiments of like elements can be designated using a different number of superscript indicator apostrophes (e.g., 10', 10'', 10''').

In the figures, certain layers, components or features may be exaggerated for clarity, and broken lines illustrate optional features or operations unless specified otherwise. This invention may, however, be embodied in many different forms and should not be construed as limited to the embodiments set forth herein; rather, these embodiments are provided so that this disclosure will be thorough and complete, and will fully convey the scope of the invention to those skilled in the art.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention. The sequence of operations (or steps) is not limited to the order presented in the claims or figures unless specifically indicated otherwise.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the specification and relevant art and should not be interpreted in an idealized or overly formal sense unless expressly so defined herein. Well-known functions or constructions may not be described in detail for brevity and/or clarity.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

As used herein, phrases such as "between X and Y" and "between about X and Y" should be interpreted to include X and Y. As used herein, phrases such as "between about X and Y" mean "between about X and about Y." As used herein, phrases such as "from about X to Y" mean "from about X to about Y."

Pursuant to embodiments of the present invention, strand mounts are provided that may provide for easy installation and reduced manufacturing costs. Strand mount assemblies are also provided. Embodiments of the present invention will now be discussed in greater detail with reference to FIGS. 2A-4.

Figure 2A:
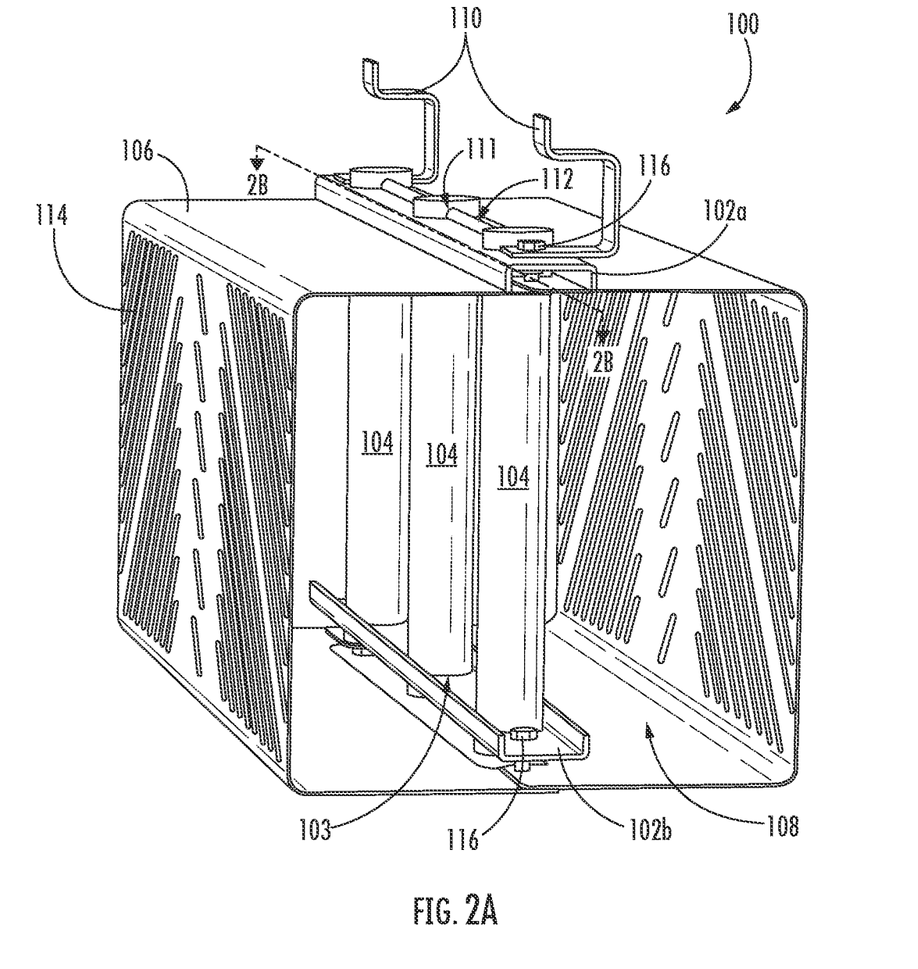
FIG. 2A is a perspective view of a strand mount according to embodiments of the present invention.
Figure 2B:
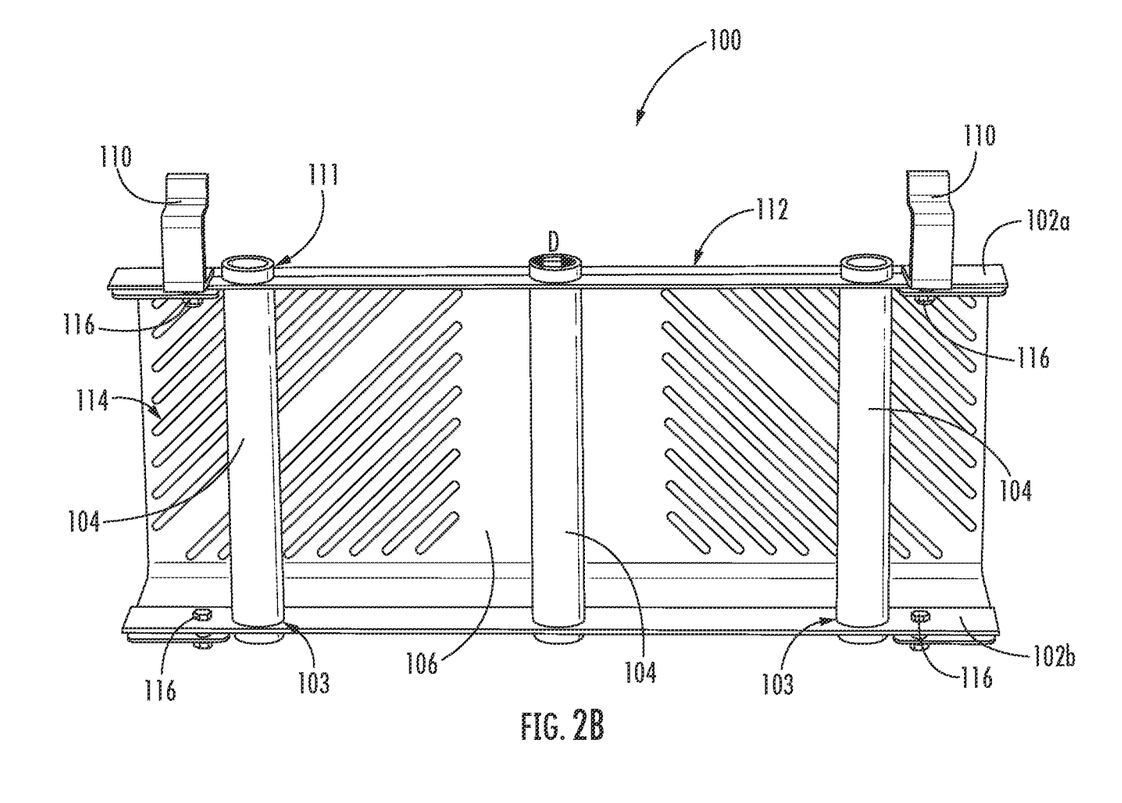
FIG. 2B is a cross-sectional view of the strand mount of FIG. 2A taken along line 2B-2B.

Referring to FIGS. 2A-2B, a strand mount 100 according to embodiments of the present invention is illustrated. The strand mount 100 includes a plurality of mounting tubes 104. For example, as shown in FIGS. 2A-2B, in some embodiments, the strand mount 100 may include three (3) mounting tubes 104. As discussed in further detail below, the mounting tubes 104 are configured such that one or more small cell radios 150 and/or antennas 160 (or other related telecommunications equipment) may be mounted and secured thereto (see, e.g. FIGS. 3A-3C and FIG. 4). As shown in FIGS. 2A-2B, in some embodiments, the mounting tubes 104 have a circular cross-sectional shape. In some embodiments, the mounting tubes 104 have a diameter (D) in the range of about 0.5 inches to about 4 inches. However, the cross-sectional shape of the mounting tubes 104 is not limited to circular, and in some embodiment, may have a variety of different polygonal cross-sectional shapes. In some embodiments, different sections of the mounting tubes 104 may vary in diameter. For example, in some embodiments, the top and bottom portions of a mounting tube 104 may have a wider diameter than the section portion or vice versa. In some embodiments, the mounting tubes 104 may have one or more additional features configured to assist in securing the small cell radios 150 and/or antennas 160 to the mounting tube 104, such as, flanges, preformed apertures, or the like.

The strand mount 100 of the present invention further includes a pair of retaining members 102a, 102b (e.g., a top retaining member 102a and bottom retainer member 102b). Each retaining member 102a, 102b comprises a plurality of corresponding apertures 103. In some embodiments, each retaining member 102a, 102b has an equal number of apertures 103 as mounting tubes 104. For example, as shown in FIGS. 2A-2B, each retaining member 102a, 102b has three (3) corresponding apertures 103. Each aperture 103 is sized and configured to receive a respective end of a mounting tube 104. As shown in FIGS. 2A-2B, the ends of each mounting tube 104 are received by a respective aperture 103 in the retaining members 102a, 102b. Together the mounting tubes 104 and the retaining members 102a, 102b provide structural support to the strand mount 100.

Still referring to FIGS. 2A-2B, in some embodiments, the strand mount 100 of the present invention further includes a retention rod 112. The retention rod 112 extends through apertures 111 located in a top portion of each mounting tube 104. As shown in FIGS. 2A-2B, the top portion of each mounting tube 104 extends through the apertures 103 in the top retaining member 102a such that the apertures 111 in each mounting tube 104 are above a top surface of the retaining member 102a. The retention rod 112 extends along the length of the top retaining member 102a and through each of the apertures 111 in each mounting tube 104, thereby securing each mounting tube 104 to the top retaining member 102a. In addition to securing each mounting tube 104 to the top retaining member 102a, the retention rod 112 may also help prevent rotation of the mounting tubes 104 relative to the retaining member 102a. In some embodiments, a similar retention rod 112 may secure a bottom portion of each mounting tube 104 to the bottom retaining member 102b in a similar manner.

In some embodiments, the strand mount 100 of the present invention further includes a polymeric cover 106. The polymeric cover 106 may further protect any telecommunications equipment (i.e., radios 150, antennas 160, etc.) that may be secured to the mount 100. The polymeric cover 106 is dimensioned to fit around the one or more small cell radios 150 and/or antennas 160 (i.e., the telecommunications equipment fits within an interior 108 of the cover 106) (see, e.g., FIGS. 3A-3C and FIG. 4). In some embodiments, the cover 106 comprises high-density polyethylene (HDPE). In some embodiments, the cover 106 may be secured to the retaining members 102a, 102b via a plurality of mechanical fasteners 116, for example, bolts, screws, or other like fasteners. Other known methods of securing the cover 106 to the retaining members 102a, 102b may be used.

In some embodiments, the polymeric cover 106 of the strand mount 100 may include perforations 114 (e.g., ventilation holes or slots). Telecommunications equipment (e.g., small cell radios 150 and antennas 160) typically generate heat during operation. When the radios 150 and/or antennas 160 are mounted within the interior 108 of the mount 100, the perforations 114 in the cover 106 can allow some of the heat generated by the telecommunications equipment 150, 160 to escape and also allow air to circulate through the mount 100, thereby helping to prevent the equipment (i.e., radios 150 and/or antennas 160) from overheating. The perforations 114 can also help to further reduce the overall weight of the mount 100, making installation less burdensome (i.e., increased serviceability of the mount 100), allowing the mount 100 to meet certain weight limitations of different cable strands 20, and reducing costs.

As shown in FIGS. 2A-2B, the strand mount 100 of the present invention further includes one or more mounting brackets 110. The mounting brackets 110 are configured to hang (and secure) the strand mount 100 on a cable strand 20, for example, the mount 100 may be mounted horizontally, or parallel, in relation to a ground surface (see, e.g., FIG. 4). In some embodiments, the strand mount 100 may be configured to have the dual capability of being mountable on either a cable strand 20 or a pole (or other mounting structure). For example, in some embodiments, the same mounting brackets 110, in combination with one or more reinforcing mounting brackets, may be configured to mount the strand mount 100 to a pole or other mounting structure (e.g., the mount 100 may be mounted vertically, or perpendicular, in relation to the ground surface) (similar to the strand mount described in U.S. Provisional Patent Application Ser. No. 62/975,339 filed Feb. 12, 2020, the disclosure of which is incorporated herein by reference in its entirety).

In some embodiments, the mount brackets 110 of the strand mount 100 of the present invention may be bent around the cable strand 20 to secure the mount brackets 110 to the cable strand 130. Other industry standard strand hangers may be used for the mounting brackets 110. In some embodiments, the mounting brackets 110 are secured to the top retaining member 102a via bolts 116. In some embodiments, two mounting brackets 110 residing at opposite ends of the strand mount 100 may hold the retaining rod 112 in place (i.e., prevent from sliding out) when the retaining rod 112 is inserted through each of the mounting tubes 104. As shown in FIG. 2A, in some embodiments, the same bolt 116 may secure both the cover 106 and a mounting bracket 110 to the top retaining member 102a. In some embodiments, the mounting brackets 110 may be formed from aluminum or an aluminum alloy.

In some embodiments, the mounting tubes 104, retaining members 102a, 102b, and/or retention rod(s) 112 comprise a polymeric material. For example, in some embodiments, the mounting tubes 104, retaining members 102a, 102b, and/or retention rod(s) 112 are formed of a fiber reinforced polymer (FRP). In some embodiments, the fiber reinforced polymer may be formed by pultrusion. In some embodiments, the strand mount 100 may be monolithic. For example, in some embodiments, the strand mount 100 of the present invention may be formed by blow molding or rotational molding.

Being comprised of composite materials (i.e., FRP, HDPE, and UV stable acrylonitrile butadiene styrene (ABS)), the strand mount 100 of the present invention is extremely light weight, in addition to being electromagnetic and radio frequency transparent. For example, in some embodiments, the strand mount 100 of the present invention may have an overall weight in the range of about 2 pounds to about 6 pounds. Thus, the strand mount 100 of the present invention may have an overall weight that is approximately 60% less than strand mounts currently available in the market. The lighter overall weight of the strand mount 100 of the present invention may allow for an additional radio 150 or antenna 160 to be secured to the mount 100 and still being light enough to be secured (hung) on a cable strand 20 while still meeting weight limitations or other constraints (e.g., by strand owners or the FCC). For example, in some embodiments, the strand mount 100 of the present invention may be capable of supporting all loading permissible by the weight limitations of the strand. However, this configuration could support greater loads, and other embodiments may have much improved strength by altering the retaining members 102a, 102b, retention rod(s) 112, and/or mounting tubes 104. For example, in some embodiments this may include changing cross-sectional geometry and/or changing dimensions of current shape of the retaining members 102a, 102b, retention rod(s) 112, and/or mounting tubes 104.

Figure 3A:
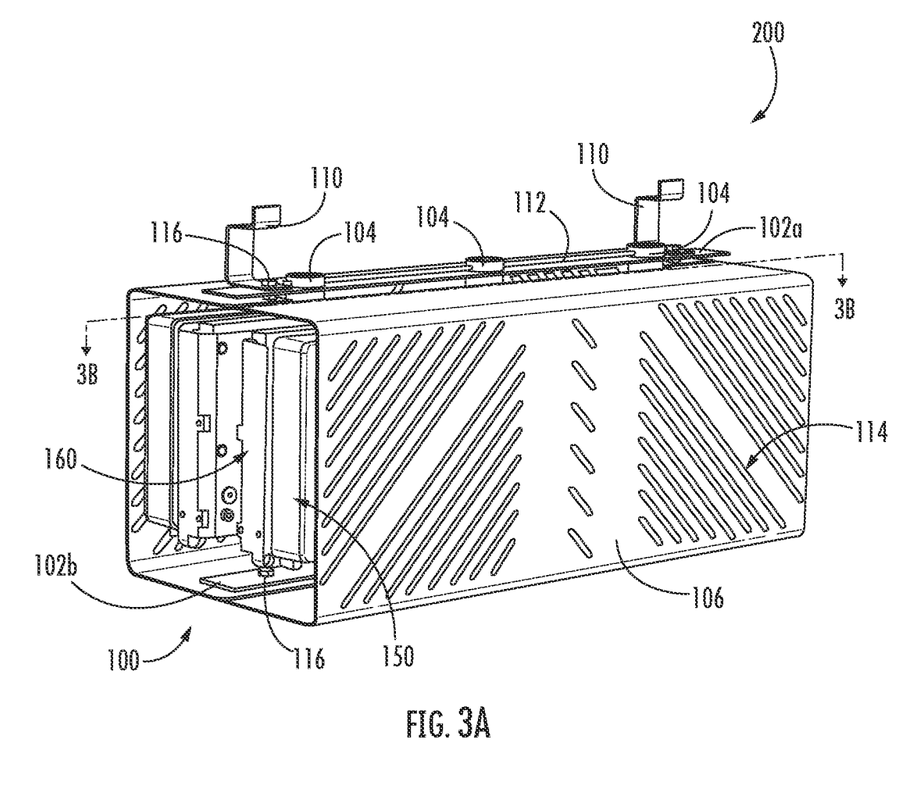
FIG. 3A is a perspective view of the strand mount of FIG. 2A, wherein equipment is installed within the strand mount.
Figure 3B:
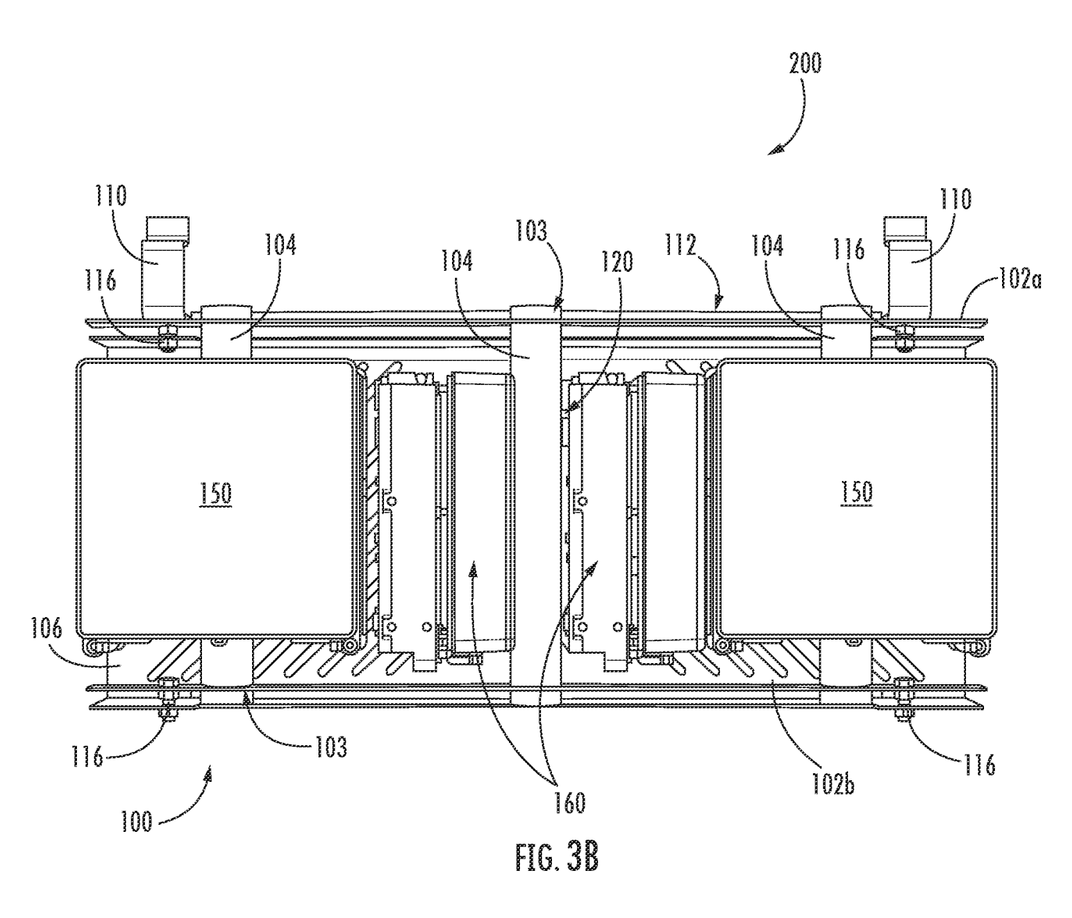
FIG. 3B is cross-sectional view of the strand mount assembly of FIG. 3A taken along line 3B-3B.
Figure 3C:
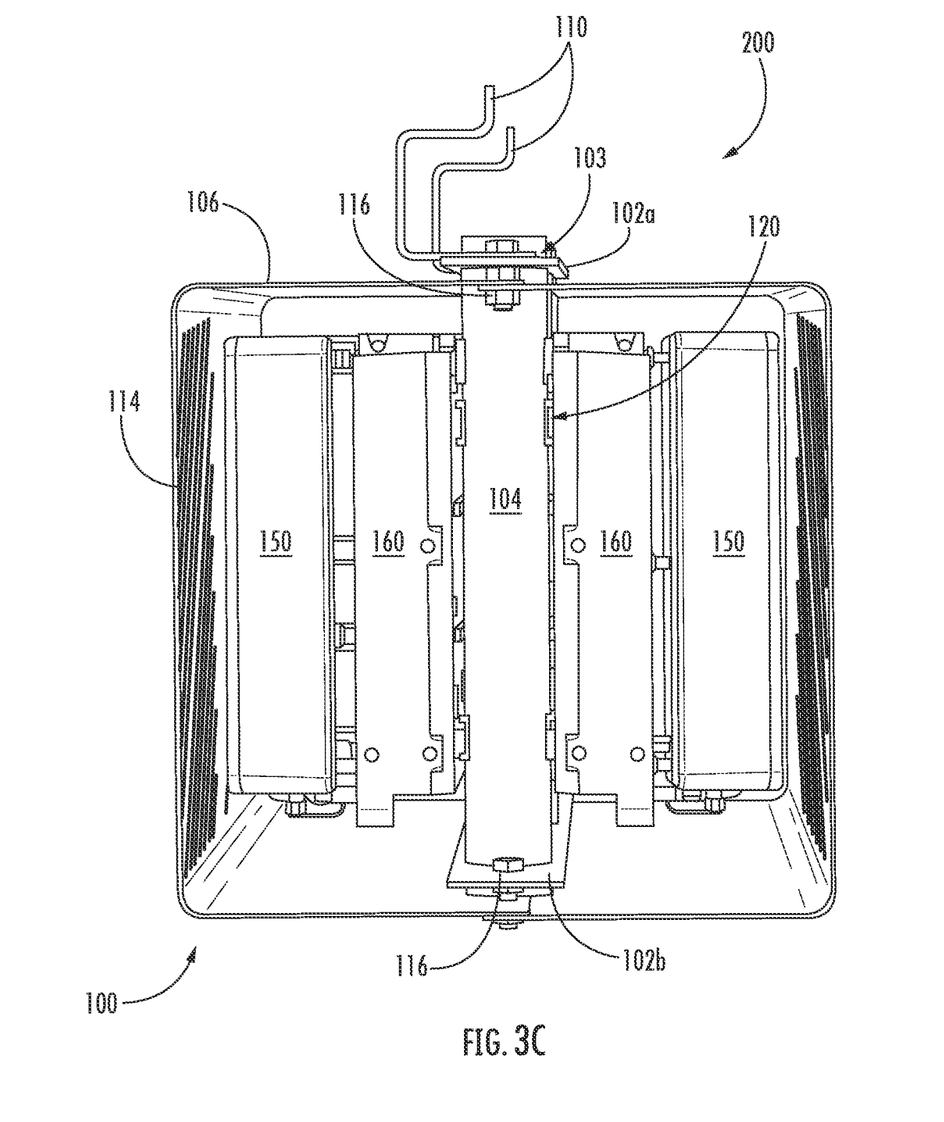
FIG. 3C is a side view of the strand mount assembly of FIG. 3A.

Referring now to FIGS. 3A-3C and FIG. 4, a strand mount assembly 200 according to embodiments of the present invention is illustrated. The assembly 200 may comprise a plurality of small cell radios 150 and/or antennas 160 (or other telecommunications equipment, such as, diplexers) mounted to the mounting tubes 104 of the strand mount 100. For example, as shown in FIGS. 3A-3C, six (6) radios 150 and/or antennas 160 may be mounted to the mounting tubes 104 of the mount 100. In some embodiments, smaller diameter mounting tubes 104 may be used which may further reduce the overall weight of the strand mount 100 and increase mounting space within the interior 108 of the strand mount 100. In some embodiments, the radios 150 and/or antennas 160 may be mounted to the mounting tubes 104 by bands 120 or other similar fasteners.

Figure 4:
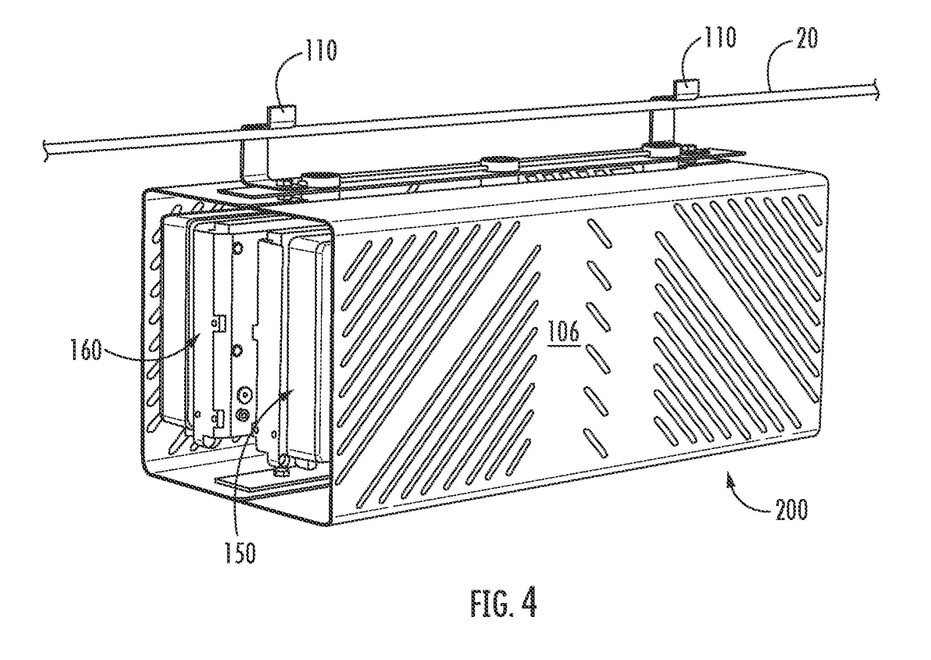
FIG. 4 is a perspective view of the strand mount assembly of FIG. 3A mounted on a cable strand.

As shown in FIG. 4, the mounting brackets 110 of the strand mount 100 are configured to hang (and secure) the strand mount assembly 200 on a cable strand 20 (e.g., mounted horizontally relative to a ground surface).

The foregoing is illustrative of the present invention and is not to be construed as limiting thereof. Although exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention as defined in the claims. The invention is defined by the following claims, with equivalents of the claims to be included therein.

That which is claimed is:

1. A strand mount, comprising:
    a plurality of polymeric mounting tubes configured such that one or more small cell radios and/or antennas can be mounted thereto;
    a pair of polymeric retaining members, each retaining member comprising a plurality of apertures sized and configured to receive a corresponding end of each mounting tube, wherein the apertures of one retaining member receive a top portion of each mounting tube and the apertures of the other retaining member receive a bottom portion of each mounting tube;
    a polymeric retaining rod extending through the top portion of each mounting tube, wherein the retaining rod secures each mounting tube to one of the retaining members and prevents rotation of the mounting tubes relative to the retaining member; and
    one or more mounting brackets configured to secure the strand mount on a cable strand.

2. The strand mount of claim 1, further comprising a polymeric cover dimensioned to fit around the one or more small cell radios and/or antennas.

3. The strand mount of claim 2, wherein the polymeric cover comprises perforations.

4. The strand mount of claim 2, wherein the polymeric cover comprises high-density polyethylene (HDPE).

5. The strand mount of claim 1, wherein the mount comprises two mounting brackets, each mounting bracket is secured at opposing ends of the top retaining member and prevents the retaining rod from sliding out from the top portions of each mounting tube.

6. The strand mount of claim 1, wherein the mounting tubes, the retaining members, and/or the retaining rod are formed of a fiber reinforced polymer.

7. The strand mount of claim 1, wherein the mount has an overall weight in the range of about 2 pounds to about 6 pounds.

8. The strand mount of claim 1, wherein the mount was formed by blow molding or rotational molding.

9. The strand mount of claim 1, wherein each of the mounting tubes comprise one or more additional features configured to assist in securing the one or more small cell radios and/or antennas to the mounting tube.

10. The strand mount of any one of the preceding claims claim 1, wherein the one or more mounting brackets, in combination with one or more reinforcing mounting brackets, is configured to mount the strand mount vertically to a pole or other mounting structure.

11. A strand mount assembly, comprising:
a cable strand;
one or more small cell radios and/or antennas; and
a strand mount, the mount comprising:
 a plurality of polymeric mounting tubes;
 a pair of polymeric retaining members, each retaining member comprising a plurality of apertures sized and configured to receive a corresponding end of each mounting tube, wherein the apertures of one retaining member receive a top portion of each mounting tube and the apertures of the other retaining member receive a bottom portion of each mounting tube;
 a polymeric retaining rod extending through the top portion of each mounting tube, wherein the retaining rod secures each mounting tube to one of the retaining members and prevents rotation of the mounting tubes relative to the retaining member; and
 one or more mounting brackets;
wherein the one or more small cell radios and/or antennas are secured to the mounting tubes, and wherein the mounting brackets secure the strand mount on the cable strand.

12. The strand mount assembly of claim 11, further comprising a polymeric cover dimensioned to fit around the one or more small cell radios and/or antennas.

13. The strand mount assembly of claim 12, wherein the polymeric cover comprises perforations.

14. The strand mount assembly of claim 12, wherein the polymeric cover comprises high-density polyethylene (HDPE).

15. The strand mount assembly of claim 11, wherein the mounting tubes, the retaining members, and/or the retaining rod are formed of a fiber reinforced polymer.

16. The strand mount assembly of claim 11, wherein the mount comprises two mounting brackets, each mounting bracket is secured at opposing ends of the top retaining member and prevents the retaining rod from sliding out from the top portions of each mounting tube.

17. The strand mount assembly of claim 11, wherein each of the mounting tubes comprise one or more additional features configured to assist in securing the one or more small cell radios and/or antennas to the mounting tube.

* * * * *

UNITED STATES PATENT AND TRADEMARK OFFICE
CERTIFICATE OF CORRECTION

| | |
|---|---|
| PATENT NO. | : 11,497,129 B2 |
| APPLICATION NO. | : 17/194490 |
| DATED | : November 8, 2022 |
| INVENTOR(S) | : Severin et al. |

It is certified that error appears in the above-identified patent and that said Letters Patent is hereby corrected as shown below:

In the Claims

Column 7, Line 15, Claim 10: delete "The strand mount of any one of the preceding claims" and insert --The strand mount of claim 1--

Signed and Sealed this
Fourteenth Day of February, 2023

Katherine Kelly Vidal
*Director of the United States Patent and Trademark Office*